United States Patent
Qu et al.

(10) Patent No.: US 11,107,843 B2
(45) Date of Patent: Aug. 31, 2021

(54) ARRAY SUBSTRATE, MANUFACTURING METHOD THEREOF, AND DISPLAY PANEL

(71) Applicants: BOE TECHNOLOGY GROUP CO., LTD., Beijing (CN); BEIJING BOE DISPLAY TECHNOLOGY CO., LTD., Beijing (CN)

(72) Inventors: Lianjie Qu, Beijing (CN); Bingqiang Gui, Beijing (CN); Yonglian Qi, Beijing (CN); Hebin Zhao, Beijing (CN); Yun Qiu, Beijing (CN); Dan Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 738 days.

(21) Appl. No.: 15/775,086

(22) PCT Filed: Oct. 9, 2017

(86) PCT No.: PCT/CN2017/105371
§ 371 (c)(1),
(2) Date: May 10, 2018

(87) PCT Pub. No.: WO2018/176787
PCT Pub. Date: Oct. 4, 2018

(65) Prior Publication Data
US 2021/0159254 A1 May 27, 2021

(30) Foreign Application Priority Data
Mar. 30, 2017 (CN) .......................... 201710205221.6

(51) Int. Cl.
*H01L 27/12* (2006.01)
*G02F 1/1368* (2006.01)
(Continued)

(52) U.S. Cl.
CPC ...... *H01L 27/1251* (2013.01); *G02F 1/13624* (2013.01); *G02F 1/13685* (2021.01);
(Continued)

(58) Field of Classification Search
None
See application file for complete search history.

(56) References Cited

U.S. PATENT DOCUMENTS 9,129,927 B2    9/2015   Gupta et al.
9,818,765 B2    11/2017  Osawa et al.
(Continued)

FOREIGN PATENT DOCUMENTS

CN    105408813 A    3/2016
CN    105932032 A    9/2016
(Continued)

OTHER PUBLICATIONS

English translation of International Seach Report issued in International Application No. PCT/CN2017/105371 dated Jan. 4, 2018.
(Continued)

*Primary Examiner* — Bo B Jang
(74) *Attorney, Agent, or Firm* — McDermott Will and Emery LLP

(57) ABSTRACT

An array substrate includes a substrate, a dual-gate oxide thin film transistor TFT, an electrode for display and a polycrystalline silicon TFT. The dual-gate oxide thin film transistor TFT and the electrode for display are located in a sub-pixel on the substrate, and a drain electrode of the dual-gate oxide TFT is electrically connected to the electrode for display.

12 Claims, 6 Drawing Sheets

(51) Int. Cl.
   *G02F 1/1362* (2006.01)
   *H01L 27/32* (2006.01)
(52) U.S. Cl.
   CPC ...... *H01L 27/1259* (2013.01); *H01L 27/3244* (2013.01); *G02F 2202/104* (2013.01)

(56) References Cited

U.S. PATENT DOCUMENTS

| | | |
|---|---|---|
| 2011/0266542 A1 | 11/2011 | Ryu et al. |
| 2015/0123084 A1* | 5/2015 | Kim .................. H01L 27/1251 257/40 |
| 2015/0228799 A1 | 8/2015 | Koezuka et al. |
| 2017/0084636 A1 | 3/2017 | Lin et al. |

FOREIGN PATENT DOCUMENTS

| | | |
|---|---|---|
| CN | 105960712 A | 9/2016 |
| CN | 106847834 A | 6/2017 |

OTHER PUBLICATIONS

Search Result of Technical Disclosure Statement, BOE Confidential.

\* cited by examiner

ARRAY SUBSTRATE, MANUFACTURING METHOD THEREOF, AND DISPLAY PANEL

RELATED APPLICATIONS

This application is the U.S. National Phase under 35 U.S.C. § 371 of International Patent Application No. PCT/CN2017/105371, filed on Oct. 9, 2017, which in turn claims the benefit of Chinese Patent Application No. 201710205221.6, filed on Mar. 30, 2017, the entire disclosures of which applications are incorporated by reference herein.

TECHNICAL FIELD

The present disclosure relates to the technical field of display, and more particularly to an array substrate, a manufacturing method thereof, and a display panel.

BACKGROUND

Currently, thin film transistors (TFTs for short) serve as a core of a display device and mainly include the following types of transistors: amorphous silicon thin film transistors, polycrystalline silicon thin film transistors and oxide thin film transistors.

In the amorphous silicon TFT, an active layer is made of an amorphous silicon material, the mobility of carriers of which is 0.5 $cm^2/V \cdot s$ to 1.0 $cm^2/V \cdot s$, and thus the amorphous silicon TFT basically cannot meet the requirements of the display device with large-size and high-resolution.

In the oxide TFT, an active layer is made of an oxide semiconductor material, which has a higher mobility of carriers than the amorphous silicon material. However, the oxide semiconductor material has a problem of poor stability of a threshold voltage. In practical applications, drift often occurs.

In the polycrystalline silicon TFT, an active layer is made of a polycrystalline silicon material, the mobility of carriers of which can reach 100 $cm^2/V \cdot s$ or more. However, as polycrystalline silicon material is limited by the effect of the cracking of grains during an amorphous laser crystallization process, a large leakage current exists in the polycrystalline silicon material. Therefore, when the active layer is used in a current-driven TFT, it is difficult to obtain a good display in dark state due to the large leakage current.

SUMMARY

In a first aspect, an array substrate is provided. The array substrate includes a substrate; a dual-gate oxide thin film transistor TFT located in a sub-pixel on the substrate and an electrode for display, wherein a drain electrode of the dual-gate oxide TFT is electrically connected to the electrode for display; and a polycrystalline silicon TFT, which is located on the substrate.

Optionally, the polycrystalline silicon TFT includes a polycrystalline silicon active layer, a gate insulation layer, a gate electrode, and at least one interlayer insulation layer, a source electrode and a drain electrode, which are sequentially arranged on the substrate, and the source electrode and the drain electrode of the polycrystalline silicon TFT are in contact with the polycrystalline silicon active layer through two first through holes, respectively, the two first through holes being provided in the gate insulation layer and the at least one interlayer insulation layer. A bottom-gate electrode of the dual-gate oxide TFT and the gate electrode of the polycrystalline silicon TFT are formed synchronously.

Further optionally, the at least one interlayer insulation layer includes a first interlayer insulation sub-layer and a second interlayer insulation sub-layer. The second interlayer insulation sub-layer is located on one side of the first interlayer insulation sub-layer away from the substrate. The first interlayer insulation sub-layer and the second interlayer insulation sub-layer cover the bottom-gate electrode. An oxide semiconductor active layer of the dual-gate oxide TFT is located between the first interlayer insulation sub-layer and the second interlayer insulation sub-layer.

Further optionally, a top gate electrode, a source electrode, and a drain electrode of the dual-gate oxide TFT are located on a side of the oxide semiconductor active layer away from the substrate. The source electrode and the drain electrode of the dual-gate oxide TFT are in contact with the oxide semiconductor active layer through two second through holes, respectively, and the two second through holes are provided in the second interlayer insulation sub-layer. The source electrode and the drain electrode of the polycrystalline silicon TFT, and the top gate electrode, the source electrode and the drain electrode of the dual-gate oxide TFT are formed synchronously.

Optionally, the array substrate further includes a buffer layer covering the substrate. The dual-gate oxide TFT and the polycrystalline silicon TFT are both located on a side of the buffer layer away from the substrate.

Based on the above contents, optionally, the substrate includes a display area and a peripheral area, and the polycrystalline silicon TFT is located within the peripheral area. The bottom-gate electrode and the top gate electrode of the dual-gate oxide TFT are electrically connected to a gate line, and the source electrode of the dual-gate oxide TFT is electrically connected to a data line. The electrode for display is a pixel electrode.

Optionally, the substrate includes the display area, and the polycrystalline silicon TFT and the dual-gate oxide TFT are located in the sub-pixel within the display area. The electrode for display is an anode electrode.

Further optionally, the gate electrode of the polycrystalline silicon TFT is electrically connected to the gate line, the source electrode of the polycrystalline silicon TFT is electrically connected to the data line, and the drain electrode of the polycrystalline silicon TFT is electrically connected to the bottom-gate electrode and the top gate electrode of the dual-gate oxide TFT.

In a case that the polycrystalline silicon TFT and the dual-gate oxide TFT are located in the sub-pixel within the display area, optionally, the array substrate further includes a polycrystalline silicon pattern layer located between the bottom-gate electrode and the substrate. An orthographic projection of the polycrystalline silicon patterned layer on the substrate and an orthographic projection of the bottom-gate electrode on the substrate have an overlapping area. The polycrystalline silicon pattern layer and the polycrystalline silicon active layer are synchronously formed.

In a second aspect, a display panel is provided, which includes the array substrate described in the first aspect.

In a third aspect, a method for manufacturing the array substrate is provided, which includes: forming a dual-gate oxide TFT located in the sub-pixel on a substrate and a electrode for display, wherein a drain electrode of the dual-gate oxide TFT is electrically connected to the electrode for display; and forming a polycrystalline silicon TFT on the substrate.

Optionally, a step of forming the polycrystalline silicon TFT and the dual-gate oxide TFT includes:

forming a polycrystalline silicon active layer on the substrate in a single patterning process, and forming a gate insulation layer on the polycrystalline silicon active layer, wherein the gate insulation layer is tiled on the substrate; forming a gate electrode of the polycrystalline silicon TFT and a bottom-gate electrode of the dual-gate TFT in a single patterning process on the substrate on which the gate insulation layer has been formed, and forming the first interlayer insulation sub-layer which is tiled on the substrate; forming an oxide semiconductor active layer, which is located above the bottom-gate electrode, in a single patterning process on the substrate on which the first interlayer insulation sub-layer has been formed, and forming a second interlayer insulation sub-layer which is tiled on the substrate; performing a single patterning process on the first interlayer insulation sub-layer, the second interlayer insulation sub-layer and the gate insulation layer, to at least form two first through holes which expose the polycrystalline silicon active layer, and two second through holes which expose the oxide semiconductor active layer; forming a source electrode and a drain electrode of the polycrystalline silicon TFT, a top gate electrode, a source electrode and a drain electrode of the dual-gate oxide TFT in a single patterning process after the first interlayer insulation sub-layer, the second interlayer insulation sub-layer and the gate insulation layer are etched, wherein the source electrode and the drain electrode of the polycrystalline silicon TFT are in contact with the polycrystalline silicon active layer through the two first through holes, respectively, and the source electrode and the drain electrode of the dual-gate oxide TFT are in contact with the oxide semiconductor active layer through the two second through holes, respectively.

Further optionally, the polycrystalline silicon TFT is located within a peripheral area on the substrate, and the dual-gate oxide TFT is located in the sub-pixel within the display area on the substrate.

On the basis of this, a gate line electrically connected to the bottom-gate electrode is further formed while the bottom-gate electrode is formed. A single patterning process is performed on the first interlayer insulation sub-layer, the second interlayer insulation sub-layer and the gate insulation layer, to form a third through hole which exposes the gate line or the bottom-gate electrode while the two first through holes and the two second through holes are formed. The top gate electrode is electrically connected to the gate line or the bottom-gate electrode through the third through hole. A data line which is electrically connected to the source electrode of the dual-gate oxide TFT is formed while the source electrode and the drain electrode of the dual-gate oxide TFT are formed. The electrode for display is a pixel electrode.

Optionally, both the polycrystalline silicon TFT and the dual-gate oxide TFT are located in the sub-pixel within the display area on the substrate.

On the basis of this, a gate line electrically connected to the gate electrode of the polycrystalline silicon TFT is further formed while the gate electrode of the polycrystalline silicon TFT is formed. A data line electrically connected to the source electrode and the drain electrode of the polycrystalline silicon TFT is further formed while the source electrode and the drain electrode of the polycrystalline silicon TFT are formed. A single patterning process is performed on the first interlayer insulation sub-layer, the second interlayer insulation sub-layer and the gate insulation layer, to form a fourth through hole and a fifth through hole, which expose the bottom-gate electrode, while the two first through holes and the two second through holes are formed. The drain electrode of the polycrystalline silicon TFT is electrically connected to the bottom-gate electrode through the fourth through hole, and the top-gate electrode is electrically connected to the bottom-gate electrode through the fifth through hole. The electrode for display is an anode electrode.

Furthermore, a polycrystalline silicon pattern layer is formed between the bottom-gate electrode and the substrate while the polycrystalline silicon active layer is formed. An orthographic projection of the polycrystalline silicon patterned layer on the substrate and an orthographic projection of the bottom-gate electrode on the substrate have an overlapping area.

BRIEF DESCRIPTION OF THE DRAWINGS

In order to describe technical solutions in embodiments of the present disclosure or in the prior art more clearly, the accompanying drawings to be used in the description of embodiments or the prior art will be introduced briefly. Obviously, the accompanying drawings to be described below are merely some embodiments of the present disclosure, and a person of ordinary skill in the art can obtain other drawings according to those drawings without paying any creative effort.

DETAILED DESCRIPTION

Figure 1A:
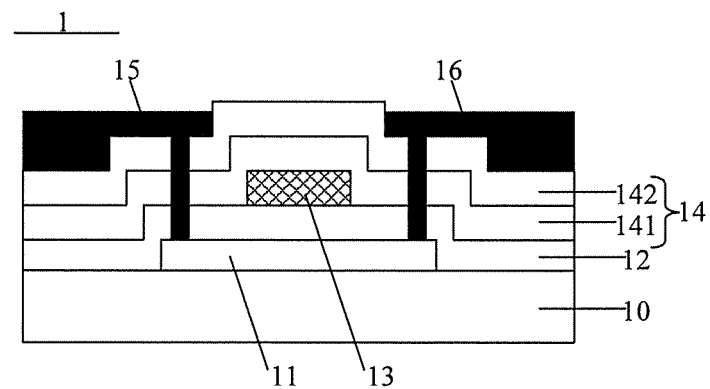
FIG. 1a is a schematic structural diagram of a polycrystalline silicon TFT according to some embodiments of the present disclosure.

The technical solutions in embodiments of the present disclosure will be described clearly and completely with reference to the accompanying drawings in the embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

In order that the display panel has a good display performance, some embodiments of the present disclosure provide an array substrate, which includes: a substrate; a dual-gate oxide thin film transistor TFT located in a sub-pixel on the substrate, and an electrode for display, wherein a drain electrode of the dual-gate oxide TFT is electrically connected to the electrode for display; and a polycrystalline silicon TFT located on the substrate.

One of the reasons why a single gate oxide TFT has a poor stability of the threshold voltage is as follows. An insulating layer, which is in contact with the oxide semiconductor active layer, has defects, and an interface between the insulating layer and the oxide semiconductor active layer acts as a channel through which carriers flow. Therefore, the defects of the interface of the insulating layer affect the fluctuation of the threshold voltage. The present disclosure employs a dual-gate oxide TFT, and thus the channel through which carriers flow can be moved into the oxide semiconductor active layer through a top gate electrode. Therefore, the effect on the threshold voltage caused by the defects in the interface of the insulating layer may be avoided, so that the threshold voltage has a better stability.

The electrode for display can depend on the type of the array substrate. For example, when the array substrate is an array substrate for a liquid crystal display device, the electrode for display is a pixel electrode. When the array substrate is an array substrate for an Organic Light Emitting Diode (OLED, for short) display device, the electrode for display is an anode electrode of the OLED.

In addition, depending on the type of the array substrate, the position where the polycrystalline silicon TFT to be located is also different. For example, when the array substrate is the array substrate for the liquid crystal display device, since only a dual-gate oxide TFT functioned as a switch needs to be provided in the sub-pixel, the polycrystalline silicon TFT can be located within a peripheral area on the substrate. Here it will be noted that, those skilled in the art should know that when a plurality of TFTs are provided within the peripheral area, these TFTs constitute a driving circuit. Based on the above contents, when polycrystalline silicon TFTs, which are part of the plurality of TFTs, are provided within the peripheral area on the substrate, all of the TFTs in the driving circuit are not limited to the polycrystalline silicon TFTs. Some or all of the plurality of TFTs in the driving circuit can be set as the polycrystalline silicon TFTs according to the advantages of polycrystalline silicon TFTs, that is, a fast switching speed and a high driving current. When part of the TFTs in the driving circuit is set as the polycrystalline silicon TFT, the type of the remaining TFTs is not limited. For example, the remaining TFTs can be the dual-gate oxide TFTs or the like.

When the array substrate is the array substrate for the OLED display device, in addition to the dual-gate oxide TFT connected to the electrode for display and having a driving function, at least one TFT functioned as a switch is located in the sub-pixel. Based on this, some or all, which are functioned as switches, of the plurality of TFTs in the sub-pixel can be set as the polycrystalline silicon TFTs. When part of the TFTs located in the sub-pixel and functioned as switches are set as the polycrystalline silicon TFTs, the type of the remaining TFTs is not limited. For example, the remaining TFTs can be the dual-gate oxide TFTs or the like.

Of course, when the array substrate is the array substrate for the OLED display device, and when the driving circuit composed of TFTs is provided within the peripheral area of the array substrate, the polycrystalline silicon TFT can be provided within the peripheral area of the array substrate. Specifically, some or all of the plurality of TFTs in the driving circuit can be set as the polycrystalline silicon TFTs according to the advantages of the polycrystalline silicon TFTs, that is, a fast switching speed and a high driving current. In this case, in addition to the dual-gate oxide TFT connected to the electrode for display and having a driving function, other TFTs functioned as switches in the sub-pixel can be set as the polycrystalline silicon TFTs, and can also be set as the dual-gate oxide TFTs.

It will be noted that, firstly, the sub-pixel is located within the display area of the substrate, and the peripheral area is located in the periphery of the display area.

Secondly, those skilled in the art should understand that, for the same type of TFT, it has a switching characteristic or a driving characteristic through a control of the aspect ratio of its channel.

Thirdly, those skilled in the art should know that, for any type of TFT, in addition to the gate electrode, one of remaining two electrodes is a source electrode and the other is a drain electrode. An electrode connected to the electrode for display is referred to the drain electrode in the embodiments of the present disclosure.

Fourthly, the dual-gate oxide TFT includes two gate electrodes, one of which is a bottom-gate electrode and the other is a top gate electrode. A gate electrode located close to the substrate is referred to the bottom-gate electrode in the embodiments of the present disclosure, and the other gate electrode located away from the substrate is referred to the top gate electrode.

The top gate electrode and the bottom-gate electrode can either be electrically connected to each other or not be electrically connected to each other.

In the array substrate provided by the embodiments of the present disclosure, the dual-gate oxide TFT has a faster switching speed when it is functioned as a switch, and has a high on-state current, a low leakage current and a stable threshold voltage when it has a driving function. Therefore, the dual-gate oxide TFT is provided in the sub-pixel, with its drain electrode of the dual-gate oxide TFT being electrically connected to the electrode for display, and the dual-gate oxide TFT has a good performance no matter whether it has a switching function or a driving function. Based on this, by further providing a polycrystalline silicon TFT in the array substrate, no matter whether the polycrystalline silicon TFT is located in the sub-pixel and functioned as a switch or is located within the peripheral area, the problem that the leakage current is large and affects the display in dark state may basically be avoided, and a faster switching speed and a high driving current may be obtained.

Optionally, as shown in FIG. 1a, the polycrystalline silicon TFT 1 includes a polycrystalline silicon active layer 11, a gate insulation layer 12, a gate electrode 13, at least one interlayer insulation layer 14, a source electrode 15 and a drain electrode 16, which are sequentially arranged on the substrate 10. The source electrode 15 and the drain electrode 16 of the polycrystalline silicon TFT are in contact with the polycrystalline silicon active layer 11 through their respective first through hole provided in the gate insulation layer 12 and the at least one interlayer insulation layer 11. On the basis of the above contents, a bottom-gate electrode of the dual-gate oxide TFT and the gate electrode 13 of the polycrystalline silicon TFT are formed synchronously.

That is, the bottom-gate electrode of the dual-gate oxide TFT and the gate electrode 13 of the polycrystalline silicon TFT are formed in a single patterning process. Therefore, the number of the patterning processes may be reduced.

Figure 1B:
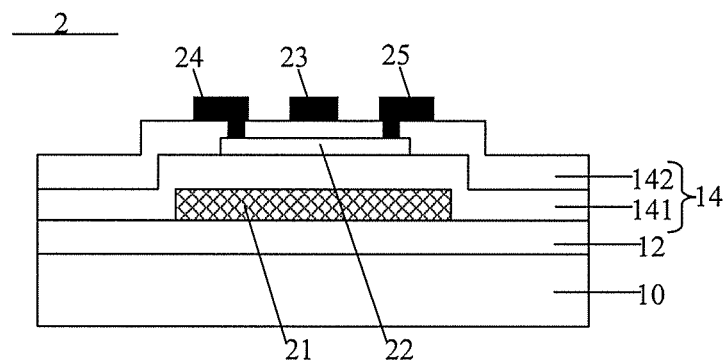
FIG. 1b is a schematic structural diagram of a dual-gate oxide TFT according to some embodiments of the present disclosure.

Further optionally, as shown in FIGS. 1a and 1b, the at least one interlayer insulation layer 14 includes a first interlayer insulation sub-layer 141 and a second interlayer insulation sub-layer 142. The second interlayer insulation sub-layer 142 is located on a side of the first interlayer insulation sub-layer 141 away from the substrate 10. The first interlayer insulation sub-layer 141 and the second interlayer insulation sub-layer 142 also cover the bottom-gate electrode 21 of the dual-gate oxide TFT. On this basis, an oxide semiconductor active layer 22 of the dual-gate oxide TFT is provided between the first interlayer insulation sub-layer 141 and the second interlayer insulation sub-layer 142.

In an area where the dual-gate oxide TFT is located, the first interlayer insulation sub-layer 141 is provided between the bottom-gate electrode 21 and the oxide semiconductor active layer 22, and corresponds to a gate insulation layer in the dual-gate oxide TFT. The second interlayer insulation sub-layer 142 is located on a side of the oxide semiconductor active layer 22 away from the substrate 10, and corresponds to an etching barrier layer in the dual-gate oxide TFT.

It will be noted that, the first interlayer insulation sub-layer 141, the second interlayer insulation sub-layer 142 and the gate insulation layer 12 are in essence insulation layers, and are all formed by laying on the substrate 10. Corresponding patterns such as through holes are formed in the corresponding layer only when needed.

In an aspect, in the area where the dual-gate oxide TFT is located, if both the first interlayer insulation sub-layer 141 and the second interlayer insulation sub-layer 142 are located between the bottom-gate electrode 21 and the oxide semiconductor active layer 22, the distance between the bottom-gate electrode 21 and the oxide semiconductor active layer 22 may be too large, resulting in a decreased driving capability of the dual-gate oxide TFT. In the embodiments of the present disclosure, only the first interlayer insulation sub-layer 141 is located between the bottom-gate electrode 21 and the oxide semiconductor active layer 22, so that the problem that the driving ability of the dual-gate oxide TFT decreases due to a too large distance between the bottom-gate electrode 21 and the oxide semiconductor active layer 22 may substantially be avoided. In another aspect, in the area where the dual-gate oxide TFT is located, since the second interlayer insulation sub-layer 142 corresponds to an etching barrier layer, the influence of an etching, which is performed in subsequent processes to form a metal electrode above the oxide semiconductor active layer 22, on the oxide semiconductor active layer 22 may be substantially avoided, so that the stability of the threshold value may further be ensured. In another aspect, in the area where dual-gate oxide TFT is located, since the first interlayer insulation sub-layer 141 corresponds to the gate insulation layer of the dual-gate oxide TFT and the second interlayer insulation sub-layer 142 corresponds to the etching barrier layer of the dual-gate oxide TFT, the process may be simplified and the cost may be reduced.

Further optionally, as shown in FIG. 1b, a top gate electrode 23, a source electrode 24 and a drain electrode 25 of the dual-gate oxide TFT are located at a side of the oxide semiconductor active layer 22 away from the substrate 10. The source electrode 24 and the drain electrode 25 of the dual-gate oxide TFT are in contact with the oxide semiconductor active layer 22 through their respective second through holes provided in the second interlayer insulation sub-layer 142. On this basis, as shown in FIG. 2, the source electrode 15 and the drain electrode 16 of the polycrystalline silicon TFT and the top gate electrode 23, the source electrode 24 and the drain electrode 25 of the dual-gate oxide TFT are formed synchronously.

Figure 2:
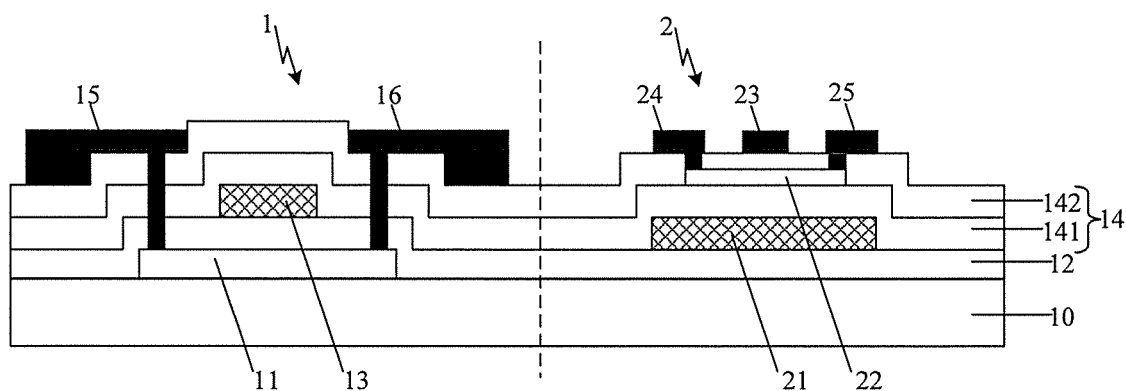
FIG. 2 is a first schematic structural diagram of an array substrate provided with a polycrystalline silicon TFT and a dual-gate oxide TFT according to some embodiments of the present disclosure.

As shown in FIG. 2, the bottom-gate electrode 21, the first interlayer insulation sub-layer 141, the oxide semiconductor active layer 22, the second interlayer insulation sub-layer 142, the top gate electrode 23, the source electrode 24 and the drain electrode 25, which are sequentially arranged on the substrate 10, constitute the dual-gate oxide TFT 2.

The bottom-gate electrode 21 of the dual-gate oxide TFT and the gate electrode 13 of the polycrystalline silicon TFT are formed in a single patterning process. The top gate electrode 23, the source electrode 24 and the drain electrode 25 of the dual-gate oxide TFT and the source electrode 15 and the drain electrode 16 of the polycrystalline silicon TFT are formed in a single patterning process. In this way, on the basis of the number of the patterning processes for manufacturing the polycrystalline silicon TFT 1, the polycrystalline silicon TFT 1 and the dual-gate oxide TFT 2 may be formed on the substrate 10 only by adding a single patterning process for manufacturing the oxide semiconductor active layer 22.

Figure 3:
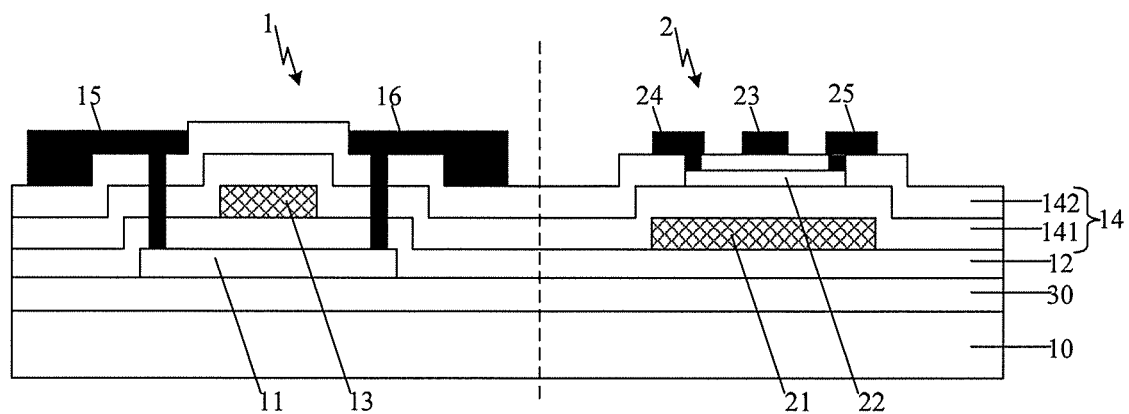
FIG. 3 is a second schematic structural diagram of an array substrate provided with a polycrystalline silicon TFT and a dual-gate oxide TFT according to some embodiments of the present disclosure.

Optionally, as shown in FIG. 3, the array substrate further includes a buffer layer 30 covering the substrate 10. Both the dual-gate oxide TFT 2 and the polycrystalline silicon TFT 1 are arranged on a side of the buffer layer 30 away from the substrate 10. That is, the buffer layer 30 is located between the substrate 10 and both of the polycrystalline silicon TFT 1 and the dual-gate oxide TFT 2.

In the embodiments of the present disclosure, by providing the buffer layer 30, impurities included in the substrate 10 may be blocked from diffusing into the polycrystalline silicon active layer 11, so that the effect of the impurities on the performance of the polycrystalline silicon TFT 1 may be avoided.

Figure 4:
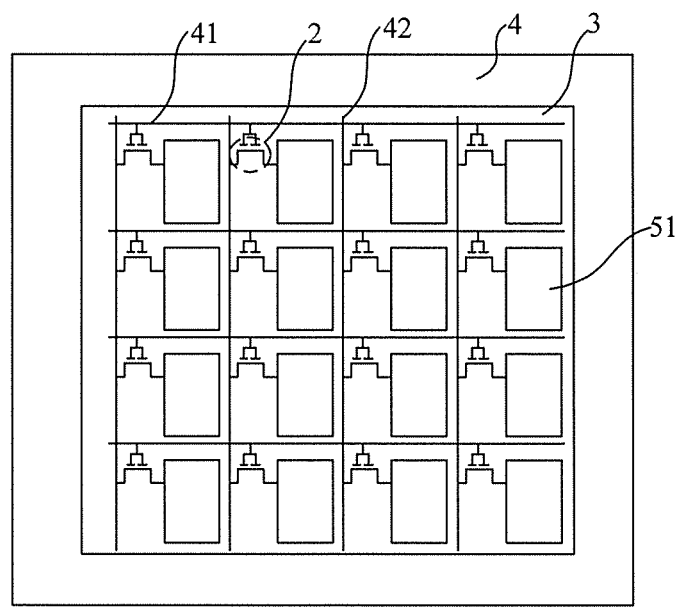
FIG. 4 is a schematic diagram of a connection relationship of a dual-gate oxide TFT located in a sub-pixel of an array substrate with a gate line, a data line and a pixel electrode according to some embodiments of the present disclosure.

Based on the above contents, optionally, as shown in FIG. 4, the substrate 10 includes a display area 3 and a peripheral area 4. The polycrystalline silicon TFT is located within the peripheral area 4. The dual-gate oxide TFT 2 is located in the sub-pixel within the display area 3. Based on this, the bottom-gate electrode 21 and the top gate electrode 23 of the dual-gate oxide TFT are electrically connected to a gate line 41, and the source electrode 24 of the dual-gate oxide TFT is electrically connected to a data line 42. The drain electrode of the dual-gate oxide TFT is electrically connected to a pixel electrode 51 (i.e., the electrode for display is the pixel electrode).

In this case, the array substrate is an array substrate for a liquid crystal display device.

Specifically, the dual-gate oxide TFT 2 is located in the sub-pixel and is functioned as a switch. When a scanning signal is input into the gate line 41, the dual-gate oxide TFT 2 is turned on, and a data signal in the data line 42 is written into the pixel electrode 51. When the array substrate is applied to the display panel, a voltage is formed between the pixel electrode 51 and a common electrode located in the array substrate or a cell substrate, and liquid crystals are driven to deflect so that the display panel displays an image.

The polycrystalline silicon TFT 1 is provided in the driver circuit within the peripheral area 4 and has a switching function or a driving function.

It will be noted that, the bottom-gate electrode 21 and the top gate electrode 23 of the dual-gate oxide TFT are electrically connected to the gate line 41. For example, the possible cases are as follows.

The bottom-gate electrode 21 and the top gate electrode 23 of the dual-gate oxide TFT are electrically connected to the same gate line 41. In this case, optionally, the gate line 41 and the bottom-gate electrode 21 are formed in a single patterning process.

Alternatively, the bottom-gate electrode 21 and the top gate electrode 23 of the dual-gate oxide TFT can be electrically connected to their respective gate line 41. That is, the bottom-gate electrode 21 is electrically connected to one gate line 41, the top gate electrode 23 is electrically connected to another gate line 41, and the two gate lines 41 are insulated from each other. In this case, optionally, both of the two gate lines 41 and the bottom-gate electrode 21 are formed in a single patterning process, the bottom-gate electrode 21 is electrically connected to one gate line 41, and the top gate electrode 23 is electrically connected to the other gate line 41 through a through hole. It should be understood by those skilled in the art that for the gate lines 41 connected to the bottom-gate electrode 21 and the top gate electrode 23 of the dual-gate oxide TFT, respectively, it should be ensured that the scanning signals are input into the two gate lines 41 at the same time but can be different.

Of course, the bottom-gate electrode 21 and the top gate electrode 23 of the dual-gate oxide TFT can be electrically connected to their respective gate line 41, and the gate lines 41 are electrically connected to each other.

Optionally, the substrate 10 includes the display area 3, and both the polycrystalline silicon TFT 1 and the dual-gate oxide TFT 2 are located in the sub-pixel within the display area 3. The electrode for display is the anode electrode of the OLED.

In this case, the array substrate is the array substrate for the OLED display device. The OLED includes the anode electrode, a cathode electrode, and an organic material functional layer located between the anode electrode and the cathode electrode.

It will be noted that, those skilled in the art will know that for the array substrate of the OLED display device, there are at least two TFTs in a sub-pixel. Based on this, when there are two or more TFTs in the sub-pixel, in the sub-pixel, in addition to the dual-gate oxide TFT 2 which is electrically connected to the anode electrode and has a driving function, other TFTs functioned as switches are provided. Considering the performances of the polycrystalline silicon TFT 1 and the dual-gate oxide TFT 2 comprehensively, some of the other TFTs are selected to be set as the polycrystalline silicon TFTs 1 and the remaining TFTs are set as the dual-gate oxide TFTs 2, or all of the other TFTs are set as polycrystalline silicon TFTs 1.

Furthermore, considering that the dual-gate oxide TFT 2 has a stable threshold voltage and a low leakage current when having a driving function, only two TFTs are needed to be located in the sub-pixel, one of which is the dual-gate oxide TFT 2 having a driving function and the other is the polycrystalline silicon TFT 1 having a switching function, and thus the OLED may be driven well.

Figure 5:
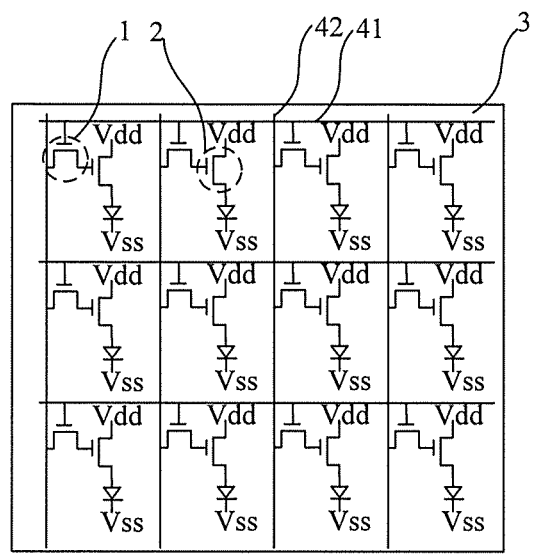
FIG. 5 is a schematic diagram of a connection relationship of a dual-gate oxide TFT and a polycrystalline silicon TFT in a sub-pixel of an array substrate with a gate line, a data line and an OLED according to some embodiments of the present disclosure.
Figure 6:
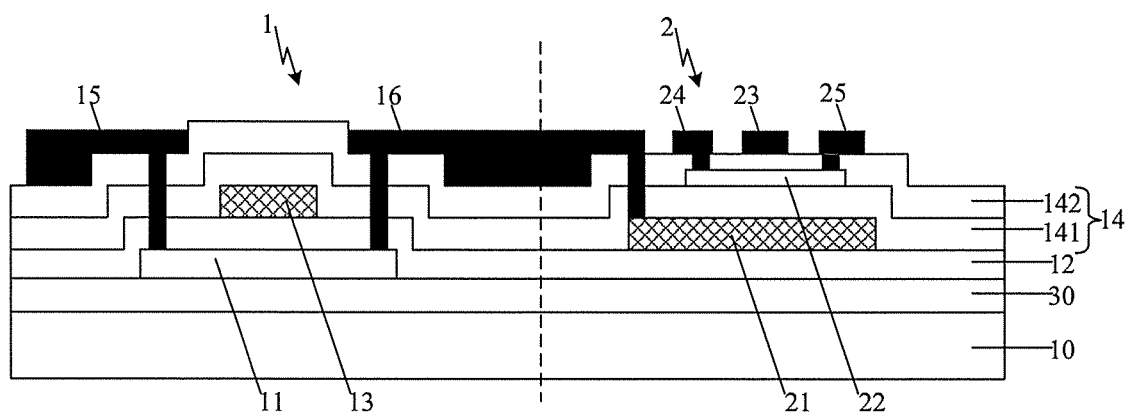
FIG. 6 is a third schematic structural diagram of an array substrate provided with a polycrystalline silicon TFT and a dual-gate oxide TFT according to some embodiments of the present disclosure.

Based on this, as shown in FIGS. 5 and 6, the gate electrode 13 of the polycrystalline silicon TFT is electrically connected to the gate line 41. The source electrode 15 of the polycrystalline silicon TFT is electrically connected to the data line 42. The drain electrode 16 of the polycrystalline silicon TFT is electrically connected to the bottom-gate electrode 21 and the top gate electrode 23 of the dual-gate oxide TFT (the electrical connection between the bottom-gate electrode 21 and the top gate electrode 23 is not illustrated in FIG. 6).

Specifically, the polycrystalline silicon TFT 1 is located in the sub-pixel and is functioned as a switch. The dual-gate oxide TFT 2 is located in the sub-pixel and has a driving function. The source electrode 24 of the dual-gate oxide TFT is electrically connected to a high voltage terminal Vdd, and the cathode electrode of the OLED is electrically connected to the low voltage terminal Vss. When the scanning signal is input into the gate line 41, the polycrystalline silicon TFT 1 is turned on. On one hand, the data signal in the data line 42 controls the turning on of the dual-gate oxide TFT 2 so that the voltage of the high voltage terminal Vdd is input to the dual-gate oxide TFT 2. On the other hand, the dual-gate oxide TFT 2 outputs a current signal under the control of the data signal in the data line 42, and drives the OLED to emit light under the control of the input voltage of the bottom voltage terminal Vss.

It will be noted that, the gate line 41 and the gate electrode 13 of the polycrystalline silicon TFT can be formed in a single patterning process. The data line 42 and the source electrode 15 and the drain electrode 16 of the polycrystalline silicon TFT can be formed in a single patterning process.

Figure 7:
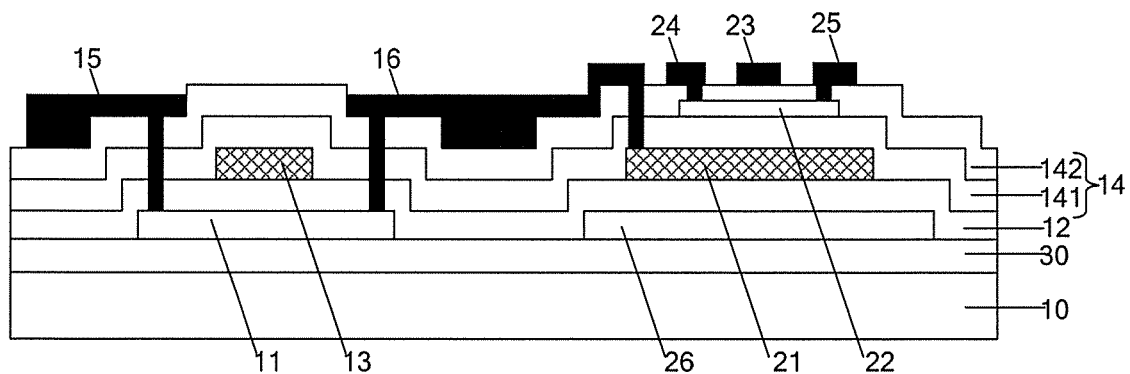
FIG. 7 is a fourth schematic structural diagram of an array substrate provided with a polycrystalline silicon TFT and a dual-gate oxide TFT according to some embodiments of the present disclosure.

When the polycrystalline silicon TFT 1 and the dual-gate oxide TFT 2 are arranged in the sub-pixel, furtherly, as shown in FIG. 7, the array substrate further includes a polycrystalline silicon pattern layer 26 located between the bottom-gate electrode 21 of the dual-gate oxide TFT and the substrate 10. An orthographic projection of the polycrystalline silicon pattern layer 26 on the substrate 10 and an orthographic projection the bottom-gate electrode 21 of the dual-gate oxide TFT on the substrate 10 have an overlapping area. The polycrystalline silicon pattern layer 26 and the polycrystalline silicon active layer 11 are synchronously formed.

Figure 8:
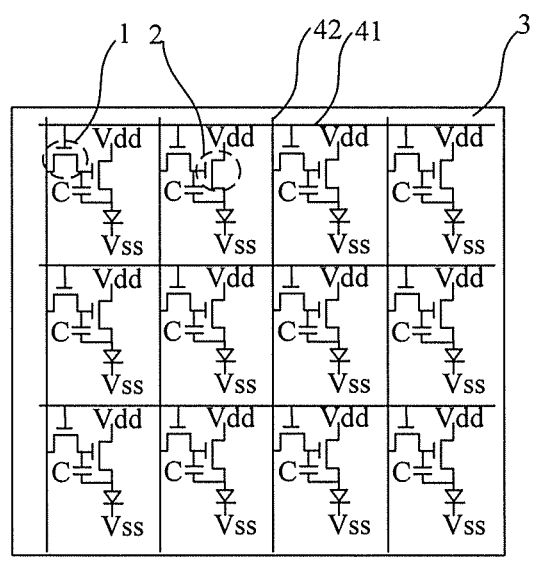
FIG. 8 is a schematic diagram of a storage capacitor added on the basis of FIG. 5.

That is, the polycrystalline silicon pattern layer 26 and the polycrystalline silicon active layer 11 constitute a storage capacitor C as shown in FIG. 8.

In the embodiments of the present disclosure, by forming the polycrystalline silicon pattern layer 26 and the polycrystalline silicon active layer 11 in a single patterning process, the number of patterning processes will not be increased.

Figure 9:
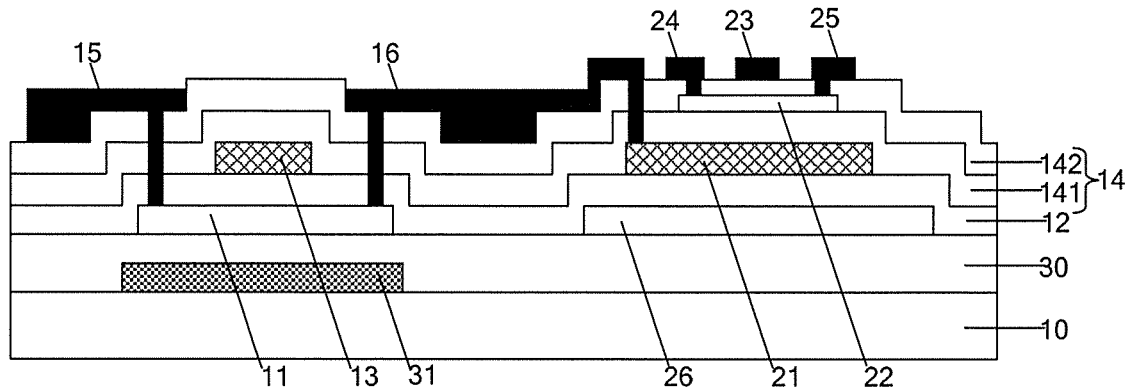
FIG. 9 is a fifth schematic structural diagram of an array substrate provided with a polycrystalline silicon TFT and a dual-gate oxide TFT according to some embodiments of the present disclosure.

When the polycrystalline silicon TFT 1 and the dual-gate oxide TFT 2 are located in the sub-pixel, furtherly, as shown in FIG. 9, the array substrate further includes a light shielding layer 31, which corresponds to a region where the polycrystalline silicon TFT 1 is located, and which is located at a side of the polycrystalline silicon active layer 11 close to the substrate 10. An orthographic projection of the light shielding layer 31 on the substrate 10 covers an orthographic projection of the polycrystalline silicon active layer 11 on the substrate 10.

In this way, light may be prevented from reaching the polycrystalline silicon active layer 11 and affecting the performance of the polycrystalline silicon TFT 1.

Figure 11:
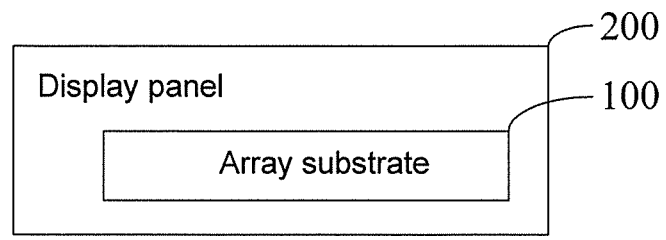
FIG. 11 is a schematic structural diagram of a display panel according to some embodiments of the present disclosure.

As shown in FIG. 11, some embodiments of the present disclosure further provide a display panel 200, which includes the array substrate 100 described above.

Specifically, when the array substrate is the array substrate for the liquid crystal display device, the display panel further includes a cell substrate. A color filter layer, a black matrix, a common electrode and the like can be provided in the cell substrate. Of course, alternatively, the color filter layer, the black matrix, the common electrode and the like can also be located in the array substrate.

When the array substrate is the array substrate for the OLED display device, the display panel further includes a package substrate located over the OLED.

The display panel provided by the embodiments of the present disclosure has the same technical effects as the array substrate described above, and the technical effects will not be described here again.

Some embodiments of the present disclosure further provide a method for manufacturing the array substrate, which includes forming a dual-gate oxide TFT 2 and an electrode for display on a substrate 10, and the dual-gate oxide TFT 2 is located in the sub-pixel. A drain electrode of the dual-gate oxide TFT is electrically connected to the electrode for display. Based on this, the method further includes forming a polycrystalline silicon TFT 1 on the substrate 10.

Depending on the type of the array substrate, the position where the polycrystalline silicon TFT 1 is formed is also different. When the array substrate is the array substrate for the liquid crystal display device, since only the dual-gate oxide TFT 2 functioned as a switch needs to be formed in the sub-pixel, the polycrystalline silicon TFT 1 can be formed within the peripheral area 4 on the substrate 10. Here, it will be noted that, those skilled in the art should know that when a plurality of TFTs are provided within the peripheral area 4, these TFTs constitute a driving circuit. Based on this, when polycrystalline silicon TFTs are formed in the peripheral region 4 of the substrate 10, all of the TFTs in the driving circuit are not limited to the polycrystalline silicon TFTs 1 and part or all of the TFTs in the driver circuit can be formed as polycrystalline silicon TFTs 1 according to the advantages of the polycrystalline silicon TFT 1. When part of the TFTs in the driving circuit is the polycrystalline silicon TFT 1, the type of the remaining TFTs is not limited. For example, the remaining TFTs can be the dual-gate oxide TFT 2 or the like.

When the array substrate is the array substrate for the OLED display device, in addition to the dual-gate oxide TFT connected to the electrode for display and having a driving function, at least one TFT functioned as a switch is further included in the sub-pixel. Based on this, some or all of the TFTs located in the sub-pixels and functioned as switches can be formed as polycrystalline silicon TFTs 1. When part of the TFTs functioned as switches in the sub-pixel are formed as the polycrystalline silicon TFTs 1, the type of the remaining TFTs is not limited. For example, the remaining TFTs can be the dual-gate oxide TFTs 2 or the like.

Of course, when the array substrate is the array substrate for the OLED display device, and the driving circuit formed by the TFTs is provided within the peripheral area 4 of the array substrate, the polycrystalline silicon TFT 1 can be formed within the peripheral area 4 on the substrate 10. Specifically, some or all of the TFTs in the driving circuit can be formed as the polycrystalline silicon TFTs 1 according to the advantages of the polycrystalline silicon TFTs 1. In this case, in addition to the dual-gate oxide TFT 2 connected to the electrode for display and having a driving function, the other TFTs functioned as switches in the sub-pixel can either be the polycrystalline silicon TFTs 1 or the dual-gate oxide TFTs 2.

In the method for manufacturing the array substrate provided by the embodiments of the present disclosure, since the dual-gate oxide TFT has a faster switching speed when it is functioned as a switch, and has a high on-state current, a low leakage current and a stable threshold voltage when it has a driving function, the dual-gate oxide TFT is formed in the sub-pixel and its drain electrode is electrically connected to the electrode for display, so that the dual-gate oxide TFT has a good performance regardless whether it is functioned as a switch or has a driving function. Based on this, by further providing the polycrystalline silicon TFT in the array substrate, the problem that the leakage current is large and thus affects the display in dark state may basically be avoided and a faster switching speed and a high driving current may be obtained no matter whether the polycrystalline silicon TFT is located in the sub-pixel and functioned as a switch or is located within the peripheral area.

Figure 10:
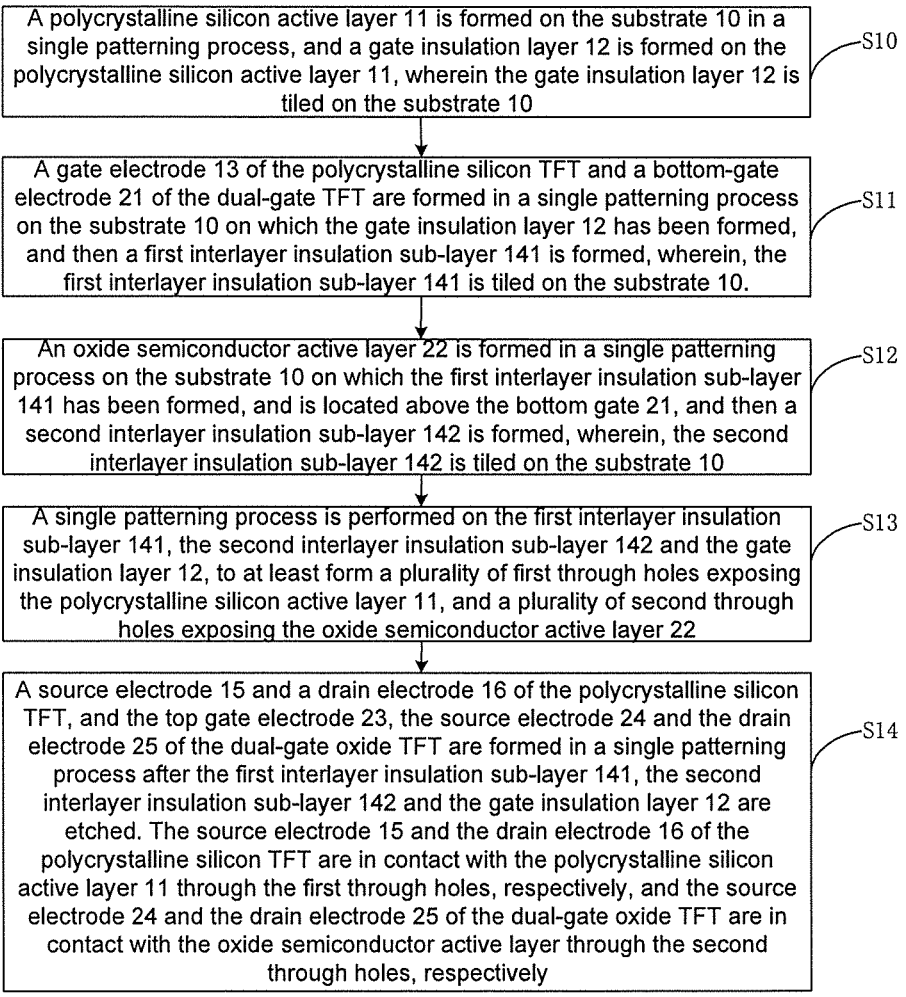
FIG. 10 is a flowchart of manufacturing an array substrate according to some embodiments of the present disclosure.

Optionally, forming the polycrystalline silicon TFT 1 and the dual-gate oxide TFT 2, as shown in FIG. 10, includes the following steps.

In S10, referring to FIG. 2, a polycrystalline silicon active layer 11 is formed on the substrate 10 in a single patterning process, and a gate insulation layer 12 is formed on the polycrystalline silicon active layer 11, wherein the gate insulation layer 12 is tiled on the substrate 10.

Forming the polycrystalline silicon active layer 11, for example, is depositing a layer of amorphous silicon thin film on the substrate 10 through a plasma enhanced chemical vapor deposition (PECVD, for short) method, and performing a dehydrogenation process on the amorphous silicon layer through a high-temperature oven to prevent a hydrogen explosion during a crystallization process and to reduce a density of a defect states inside the film after the crystallization process. After the dehydrogenation process is completed, a Low Temperature Poly-Silicon (LTPS, for short) process is performed, i.e., a crystallization process is performed on the amorphous silicon thin film by using crystallization means, such as, laser annealing (ELA), metal induced crystallization (MIC), solid phase crystallization (SPC) and the like, and then a polycrystalline silicon thin film is formed. Thereafter, a patterning process is performed on the polycrystalline silicon thin film to form the polycrystalline silicon active layer 11.

On this basis, the polycrystalline silicon active layer 11 can be doped to adjust the threshold voltage of the polycrystalline silicon TFT 1 according to the demand for performance of the polycrystalline silicon TFT 1.

In S11, referring to FIG. 2, a gate electrode 13 of the polycrystalline silicon TFT and a bottom-gate electrode 21 of the dual-gate TFT are formed in a single patterning process on the substrate 10 on which the gate insulation layer 12 has been formed, and then a first interlayer insulation sub-layer 141 is formed, wherein, the first interlayer insulation sub-layer 141 is tiled on the substrate 10.

After the gate electrode 13 of the polycrystalline silicon TFT is formed, it can be used as a barrier, and the polycrystalline silicon active layer 11 is further doped to increase the conductivity thereof in the polycrystalline silicon TFT except for the portion corresponding to the gate electrode 13, so that the contact resistance of the polycrystalline silicon active layer 11 with the source 15 and the drain 16 may be reduced.

In S12, referring to FIG. 2, an oxide semiconductor active layer 22 is formed in a single patterning process on the substrate 10 on which the first interlayer insulation sub-layer 141 has been formed, and is located above the bottom gate 21, and then a second interlayer insulation sub-layer 142 is formed, wherein, the second interlayer insulation sub-layer 142 is tiled on the substrate 10.

In S13, referring to FIG. 2, a single patterning process is performed on the first interlayer insulation sub-layer 141, the second interlayer insulation sub-layer 142 and the gate insulation layer 12, to at least form a plurality of first through holes exposing the polycrystalline silicon active layer 11, and a plurality of second through holes exposing the oxide semiconductor active layer 22.

In S14, referring to FIG. 2, a source electrode 15 and a drain electrode 16 of the polycrystalline silicon TFT, and the top gate electrode 23, the source electrode 24 and the drain electrode 25 of the dual-gate oxide TFT are formed in a single patterning process after the first interlayer insulation sub-layer 141, the second interlayer insulation sub-layer 142 and the gate insulation layer 12 are etched. The source electrode 15 and the drain electrode 16 of the polycrystalline silicon TFT are in contact with the polycrystalline silicon active layer 11 through the first through holes, respectively, and the source electrode 24 and the drain electrode 25 of the dual-gate oxide TFT are in contact with the oxide semiconductor active layer through the second through holes, respectively.

As can be seen from the above process, on the basis of the number of the patterning processes for manufacturing the polycrystalline silicon TFT 1, the polycrystalline silicon TFT 1 and the dual-gate oxide TFT 2 can be formed on the substrate 10 only by adding the single patterning process for manufacturing the oxide semiconductor active layer 22. Thus, although two types of TFTs are formed on the array substrate, processes will not be led to be overly complicated.

In an area where the dual-gate oxide TFT is located, if both the first interlayer insulation sub-layer 141 and the second interlayer insulation sub-layer 142 are formed between the bottom-gate electrode 21 and the oxide semiconductor active layer 22, the distance between the bottom-gate electrode 21 and the oxide semiconductor active layer 22 may be too large, so that the dual-gate oxide TFT has a decreased driving capability. In the embodiments of the present disclosure, only the first interlayer insulation sub-layer 141 is located between the bottom-gate electrode 21 and the oxide semiconductor active layer 22, so that the problem that the driving ability of the dual-gate oxide TFT decreases due to a too large distance between the bottom-gate electrode 21 and the oxide semiconductor active layer 22 may substantially be avoided. On the other hand, in the area where the dual-gate oxide TFT is located, since the second interlayer insulation sub-layer 142 corresponds to the etching barrier layer, the influence on the oxide semiconductor active layer 22 caused by an etching, which is performed to form metal electrodes above the oxide semiconductor active layer 22 in subsequent processes, may be substantially avoided, so that the stability of the threshold value may further be ensured. In another aspect, in the area where the dual-gate oxide TFT is located, since the first interlayer insulation sub-layer 141 corresponds to the gate insulation layer of the dual-gate oxide TFT, and the second interlayer insulation sub-layer 142 corresponds to the etching barrier layer of the dual-gate oxide TFT, the process may be simplified and the cost may be reduced.

Further optionally, the polycrystalline silicon TFT 1 is located within the peripheral area 4 on the substrate 10. The dual-gate oxide TFT 2 is located in the sub-pixel within the display area 3 on the substrate 10 (as shown in FIG. 4).

Based on this, a gate line 41 electrically connected to the bottom-gate electrode 21 is formed while the bottom-gate electrode 21 is formed. A single patterning process is performed on the first interlayer insulation sub-layer 141, the second interlayer insulation sub-layer 142 and the gate insulation layer 12, to form the first through holes and the second through holes, as well as the third through holes exposing the gate line 41 or the bottom-gate electrode 21. The top gate electrode 23 of the dual-gate oxide TFT is electrically connected to the gate line 41 or the bottom-gate electrode 21 through the third through hole. A data line 42 electrically connected to the source electrode 24 of the dual-gate oxide TFT is formed while the source electrode 24 and the drain electrode 25 of the dual-gate oxide TFT are formed.

The electrode for display is the pixel electrode.

That is, the dual-gate oxide TFT 2 is located in the sub-pixel and is functioned as a switch. The bottom-gate electrode 21 and the top gate electrode 23 of the dual-gate oxide TFT are electrically connected to the gate line 41. The source electrode 24 of the dual-gate oxide TFT is electrically connected to the pixel electrode 51. The polycrystalline silicon TFT 1 is provided in the driving circuit within the peripheral area 4, and has a switching function or a driving function.

Optionally, as shown in FIG. 5, both the polycrystalline silicon TFT 1 and the dual-gate oxide TFT 2 are located in the sub-pixel within the display area 3 on the substrate 10.

Based on this, the gate line 41 electrically connected to the gate electrode 13 of the polycrystalline silicon TFT is formed while the gate electrode 13 of the polycrystalline silicon TFT is formed. The data line 42 electrically connected to the source electrode 15 of the polycrystalline silicon TFT is formed while the source electrode 15 and the drain electrode 16 of the polycrystalline silicon TFT are formed. A single patterning process is performed on the first interlayer insulation sub-layer 141, the second interlayer insulation sub-layer 142 and the gate insulation layer 12, to form the first through holes and the second through holes as well as a fourth through hole and a fifth through hole which expose the bottom gate electrode 21. The drain electrode 16 of the polycrystalline silicon TFT is electrically connected to the bottom-gate electrode 21 through the fourth through hole. The top gate electrode 23 of the dual-gate oxide TFT is electrically connected to the bottom-gate electrode 21 through the fifth through hole.

The electrode for display is the anode electrode.

That is, the polycrystalline silicon TFT 1 is located in the sub-pixel and is functioned as a switch. The dual-gate oxide TFT 2 is located in the sub-pixel and has a driving function. The gate electrode 13 of the polycrystalline silicon TFT is electrically connected to the gate line 41. The source electrode 15 of the polycrystalline silicon TFT is electrically connected to the data line 42. The drain electrode 16 of the polycrystalline silicon TFT is electrically connected to the bottom-gate electrode 21 and the top gate electrode 23 of the dual-gate oxide TFT.

When the polycrystalline silicon TFT 1 and the dual-gate oxide TFT 2 are located in the sub-pixel, furthermore, as shown in FIG. 7, a polycrystalline silicon pattern layer 26 between the bottom gate 21 and the substrate 10 is formed while the polycrystalline silicon active layer 11 is formed. An orthographic projection of the polycrystalline silicon patterned layer 26 on the substrate 10 and an orthographic projection of the bottom-gate electrode 21 on the substrate 10 have an overlapping area.

That is, the polycrystalline silicon pattern layer 26 and the polycrystalline silicon active layer 11 constitute a storage capacitor C as shown in FIG. 8.

In the embodiments of the present disclosure, the polycrystalline silicon pattern layer 26 and the polycrystalline silicon active layer 11 are formed in a single patterning process, so that the number of patterning processes will not be led to be increased.

When the polycrystalline silicon TFT 1 and the dual-gate oxide TFT 2 are located in the sub-pixel, furthermore, as shown in FIG. 9, the method further includes forming a light shielding layer 31 which corresponds to a region where the polycrystalline silicon TFT 1 is located and which is located at a side of the polycrystalline silicon active layer 11 close to the substrate 10. An orthographic projection of the light shielding layer 31 on the substrate 10 covers an orthographic projection of the polycrystalline silicon active layer 11 on the substrate 10.

In this way, light may be prevented from reaching the polycrystalline silicon active layer 11 and affecting the performance of the polycrystalline silicon TFT 1.

Based on the above contents, optionally, as shown in FIGS. 3, 6, 7, and 9, the method further includes forming a buffer layer 30 which covers the substrate 10. Both the dual-gate oxide TFT 2 and the polycrystalline silicon TFT 1 are located at a side of the buffer layer 30 away from the substrate 10.

In the embodiments of the present disclosure, by providing the buffer layer 30, impurities included in the substrate 10 may be blocked from diffusing into the polycrystalline silicon active layer 11, so that the effect of the impurities on the performance of the polycrystalline silicon TFT 1 may be avoided.

For the array substrate, the manufacturing method thereof, and the display panel provided by the embodiments of the present disclosure, since the dual-gate oxide TFT has a faster switching speed when it is functioned as a switch, and has a high on-state current, a low leakage current and a stable threshold voltage when it has a driving function, the dual-gate oxide TFT has a good performance regardless whether it is functioned as a switch or has a driving function by forming the dual-gate oxide TFT in the sub-pixel and electrically connecting its drain to the electrode for display. Based on this, the problem that the leakage current is large and affects the display in dark state may basically be avoided, and a faster switching speed and a high driving current also may be obtained by further providing a polycrystalline silicon TFT on the array substrate whether the polycrystalline silicon TFT is located in the sub-pixel and functioned as a switch or it is located within the peripheral area.

The above is merely the specific embodiments of the present disclosure, but the scope of the disclosure is not limited thereto. The changes and modifications that can be easily made by any person skilled in the art within the technical scope are also covered within the scope of the disclosure. Therefore, the scope of the present disclosure should be based on the scope of the claims.

What is claimed is:

1. An array substrate, comprising:
   a substrate;
   a dual-gate oxide thin film transistor (TFT) located in a sub-pixel on the substrate and an electrode for display, wherein, a drain electrode of the dual-gate oxide TFT is electrically connected to the electrode for display; and
   a polycrystalline silicon TFT located on the substrate; wherein,
   the polycrystalline silicon TFT comprises a polycrystalline silicon active layer, a gate insulation layer, a gate electrode, at least one interlayer insulation layer, a source electrode and a drain electrode, which are sequentially arranged on the substrate, and the source electrode and the drain electrode of the polycrystalline silicon TFT are in contact with the polycrystalline silicon active layer through two first through holes, respectively, the two first through holes being provided in the gate insulation layer and the at least one interlayer insulation layer,
   a bottom-gate electrode of the dual-gate oxide TFT and the gate electrode of the polycrystalline silicon TFT are formed synchronously;
   the at least one interlayer insulation layer comprises a first interlayer insulation sub-layer and a second interlayer insulation sub-layer, and the second interlayer insulation sub-layer is located on a side of the first interlayer insulation sub-layer away from the substrate,
   the first interlayer insulation sub-layer and the second interlayer insulation sub-layer cover the bottom-gate electrode, and
   an oxide semiconductor active layer of the dual-gate oxide TFT is located between the first interlayer insulation sub-layer and the second interlayer insulation sub-layer.

2. The array substrate according to claim 1, wherein, a top gate electrode, a source electrode, and the drain electrode of the dual-gate oxide TFT are located on a side of the oxide semiconductor active layer away from the substrate, the source electrode and the drain electrode of the dual-gate oxide TFT are in contact with the oxide semiconductor active layer through two second through holes, respectively, the two second through holes being provided in the second interlayer insulation sub-layer, and
   the source electrode and the drain electrode of the polycrystalline silicon TET, and the top gate electrode, the source electrode and the drain electrode of the dual-gate oxide TFT are formed synchronously.

3. The array substrate according to claim 1, further comprising a buffer layer covering the substrate, wherein
   the dual-gate oxide TFT and the polycrystalline silicon TFT are both located on a side of the buffer layer away from the substrate.

4. The array substrate according to claim 1, wherein, the substrate comprises a display area and a peripheral area, and the polycrystalline silicon TFT is located within the peripheral area,
   the bottom-gate electrode and a top gate electrode of the dual-gate oxide TFT are electrically connected to a gate line, and a source electrode of the dual-gate oxide TFT is electrically connected to a data line, and
   the electrode for display is a pixel electrode.

5. The array substrate according to claim 1, wherein, the substrate comprises a display area, and the polycrystalline silicon TFT and the dual-gate oxide TFT are located in the sub-pixel within the display area, and
   the electrode for display is an anode electrode.

6. The array substrate according to claim 5, wherein, the gate electrode of the polycrystalline silicon TFT is electrically connected to a gate line, the source electrode of the polycrystalline silicon TFT is electrically connected to a data line, and the drain electrode of the polycrystalline silicon TFT is electrically connected to the bottom-gate electrode and a top gate electrode of the dual-gate oxide TFT.

7. The array substrate according to claim 5, further comprising a polycrystalline silicon pattern layer located between the bottom-gate electrode and the substrate, wherein
- an orthographic projection of the polycrystalline silicon pattern layer on the substrate and an orthographic projection of the bottom-gate electrode on the substrate have an overlapping area, and wherein
- the polycrystalline silicon pattern layer and the polycrystalline silicon active layer are formed synchronously.

8. A display panel, comprising the array substrate according to claim 1.

9. A method for manufacturing the array substrate according to claim 1, comprising,
- forming the dual-gate oxide TFT located in the sub-pixel and the electrode for display on the substrate, and
- the method further comprising:
- forming the polycrystalline silicon TFT on the substrate;
- wherein, forming the polycrystalline silicon TFT and forming the dual-gate oxide TFT comprises:
- forming a polycrystalline silicon active layer on the substrate in a single patterning process, and forming a gate insulation layer on the polycrystalline silicon active layer, wherein the gate insulation layer is tiled on the substrate;
- forming a gate electrode of the polycrystalline silicon TFT and a bottom-gate electrode of the dual-gate TFT in a single patterning process on the substrate on which the gate insulation layer has been formed, and forming a first interlayer insulation sub-layer which is tiled on the substrate;
- forming an oxide semiconductor active layer, which is located above the bottom-gate electrode, in a single patterning process on the substrate on which the first interlayer insulation sub-layer has been formed and forming a second interlayer insulation sub-layer which is tiled on the substrate;
- performing a single patterning process on the first interlayer insulation sub-layer, the second interlayer insulation sub-layer and the gate insulation layer, to at least form two first through holes which expose the polycrystalline silicon active layer, and two second through holes which exposes the oxide semiconductor active layer; and
- forming a source electrode and a drain electrode of the polycrystalline silicon TFT a top gate electrode, a source electrode and the drain electrode of the dual-gate oxide TFT in a single patterning process after the first interlayer insulation sub-layer, the second interlayer insulation sub-layer and the gate insulation layer are patterned, wherein the source electrode and the drain electrode of the polycrystalline silicon TFT are in contact with the polycrystalline silicon active layer through the two first through holes, respectively, and the source electrode and the drain electrode of the dual-gate oxide TFT are in contact with the oxide semiconductor active layer through the two second through holes, respectively.

10. The method for manufacturing according to claim 9, wherein, the polycrystalline silicon TFT is located within a peripheral area on the substrate and the dual-gate oxide TFT is located in the sub-pixel within a display area on the substrate, and the method further comprises:
- forming a gate line electrically connected to the bottom-gate electrode while the bottom-gate electrode is formed,
- performing a single patterning process on the first interlayer insulation sub-layer, the second interlayer insulation sub-layer and the gate insulation layer, to form a third through hole which exposes the gate line or the bottom-gate electrode while the two first through holes and the two second through holes are formed, wherein, the top gate electrode is electrically connected to the gate line or the bottom-gate electrode through the third through hole, and
- forming a data line electrically connected to the source electrode of the dual-gate oxide TFT while the source electrode and the drain electrode of the dual-gate oxide TFT are formed,
- wherein, the electrode for display is a pixel electrode.

11. The method for manufacturing according to claim 9, wherein, both the polycrystalline silicon TFT and the dual-gate oxide TFT are located in the sub-pixel within the display area on the substrate, and the method further comprises:
- forming a gate line electrically connected to the gate electrode of the polycrystalline silicon TFT while the gate electrode of the polycrystalline silicon TFT is formed,
- forming a data line electrically connected to the source electrode of the polycrystalline silicon TFT while the source electrode and the drain electrode of the polycrystalline silicon TFT are formed, and
- performing a single patterning process on the first interlayer insulation sub-layer, the second interlayer insulation sub-layer and the gate insulation layer, to form a fourth through hole and a fifth through hole, which expose the bottom-gate, while the two first through holes and the two second through holes are formed, wherein, the drain electrode of the polycrystalline silicon TFT is electrically connected to the bottom-gate electrode through the fourth through hole, and the top gate electrode is electrically connected to the bottom-gate electrode through the fifth through hole,
- wherein, the electrode for display is an anode.

12. The method for manufacturing according to claim 11, further comprising:
- forming a polycrystalline silicon pattern layer between the bottom-gate electrode and the substrate while the polycrystalline silicon active layer is formed,
- wherein, an orthographic projection of the polycrystalline silicon pattern layer on the substrate and an orthographic projection of the bottom-gate electrode on the substrate have an overlapping area.

* * * * *